(12) United States Patent
Chou

(10) Patent No.: US 7,715,199 B2
(45) Date of Patent: May 11, 2010

(54) INTERFACE CARD INSTALLATION APPARATUS

(75) Inventor: Shih-Kun Chou, Taipei (TW)

(73) Assignee: Asustek Computer Inc., Peitou, Taipei (TW)

(*) Notice: Subject to any disclaimer, the term of this patent is extended or adjusted under 35 U.S.C. 154(b) by 153 days.

(21) Appl. No.: 11/848,313

(22) Filed: Aug. 31, 2007

(65) Prior Publication Data
US 2008/0055866 A1 Mar. 6, 2008

(30) Foreign Application Priority Data
Sep. 1, 2006 (TW) .............................. 95132485 A

(51) Int. Cl.
*H05K 5/00* (2006.01)
(52) U.S. Cl. .................. 361/732; 361/807; 361/801
(58) Field of Classification Search ................ 361/752, 361/790, 797, 800–802, 600, 679; 439/55, 439/68, 74, 841, 842
See application file for complete search history.

(56) References Cited

U.S. PATENT DOCUMENTS 5,601,349 A * 2/1997 Holt ......................... 312/265.6
6,430,056 B1 * 8/2002 Chen ........................... 361/759
7,120,032 B2 * 10/2006 Lin et al. ..................... 361/801
7,265,997 B2 * 9/2007 Jing ............................ 361/801

FOREIGN PATENT DOCUMENTS

CN 2606919 3/2004
TW 293467 7/2006

OTHER PUBLICATIONS

English language translation of abstract of TW 293467.
English language translation of abstract of CN 2606919.

* cited by examiner

*Primary Examiner*—Hung S Bui
(74) *Attorney, Agent, or Firm*—Thomas, Kayden, Horstemeyer & Risley

(57) ABSTRACT

An interface card installation apparatus for fixing an interface card includes a base and a rotating pressing means. The base may be assembled on a case. The case has an interface card flange. The interface card has a bracket. The bracket is contacted with the interface card flange. The base has a coupling portion and the rotating pressing means may be rotated to couple with the coupling portion of the base for fixing the rotating pressing means and the bracket pressed.

20 Claims, 5 Drawing Sheets

INTERFACE CARD INSTALLATION APPARATUS

RELATED APPLICATIONS

This application claims priority to Taiwan Application Serial Number 95132485, filed Sep. 1, 2006, which is herein incorporated by reference.

BACKGROUND

1. Field of Invention

The present invention relates to an interface card installation apparatus. More particularly, the present invention relates to a screwless interface card installation apparatus.

2. Description of Related Art

Computers and their peripherals have become very popular in recent years. The efficiency of peripheral assembly and disassembly in computers has become important. Interface cards may be utilized to communicate the central processing unit and other peripherals. Common interface cards such as display cards for displaying, sound cards for sounding, and modem cards or network cards for networking are widely use in computers.

The conventional method of installing an interface card requires inserting the interface card in a card slot and using a screw to screw a bracket on the interface card to the case near the card slot.

The conventional fixing method of using screws is not convenient for the assembly process, and may reduce the assembly efficiency. Furthermore, screws left in the computer may cause a short circuit in the computer.

For the foregoing reasons, there is a need for an interface card installation apparatus that increases assembly efficiency.

SUMMARY

The present invention is directed to an interface card installation apparatus that satisfies the need for installing an interface card without using retention screws.

As embodied and broadly described herein, the invention provides an interface card installation apparatus that comprises a case, an interface card, and a rotating pressing means. The case has a base, an interface card flange, and a coupling portion. The interface card has a bracket. The bracket is in contact with the interface card flange. The rotating pressing means is disposed in the base to press the bracket on the interface card flange. The rotating pressing means is coupled with the coupling portion and is fixed on the base.

The invention also provides the interface card installation apparatus comprising a case, a base, an interface card, and a rotating pressing means. The case has an interface card flange. The base is disposed on the case, and the base has a coupling portion. The interface card includes a bracket. The bracket is in contact with the interface card flange. The rotating pressing means is disposed in the base to press the bracket on the interface card flange. The rotating pressing means is coupled with the coupling portion and is fixed on the base.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
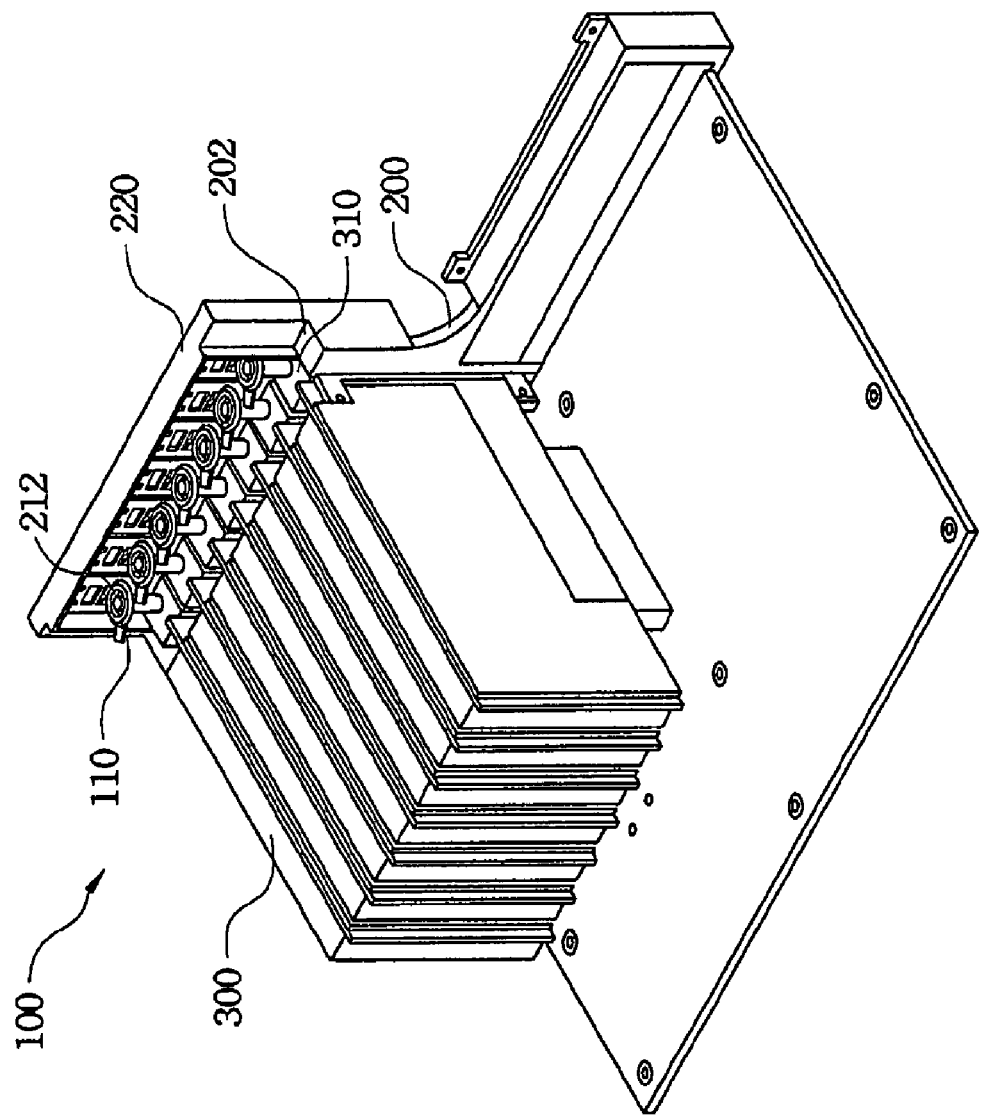
FIG. 1 is an oblique diagram of a first embodiment of an interface card installation apparatus of the invention.

Reference will now be made in detail to the present embodiments of the invention, examples of which are illustrated in the accompanying drawings. Wherever possible, the same reference numbers are used in the drawings and the description to refer to the same or like parts.

Refer to FIG. 1. FIG. 1 illustrates an oblique diagram of a first embodiment of an interface card installation apparatus of the invention. The interface card installation apparatus 100 includes a case 200, an interface card 300, and a rotating pressing means 110. The case 200 has a base 220, an interface card flange 202, and a coupling portion 212. The base 220 is disposed on the case 200. The interface card 300 has a bracket 310. The bracket 310 may touch the interface card flange 202. The rotating pressing means 110 is disposed in the base 220 to press the bracket 310 on the interface card flange 202. The interface card 300 is fixed by pressing the bracket 310 of the interface card 300 between the rotating pressing means 110 and the interface card flange 202. The rotating pressing means 110 disposed in the base 220 may be rotated to couple with the coupling portion 212 and is fixed on the base 220. The rotating pressing means 110 and the pressed bracket 310 may be fixed by coupling the rotating pressing means 110 with the coupling portion 212. The base 220 may be formed on the case 200 or be assembled on the case 200.

Figure 2:
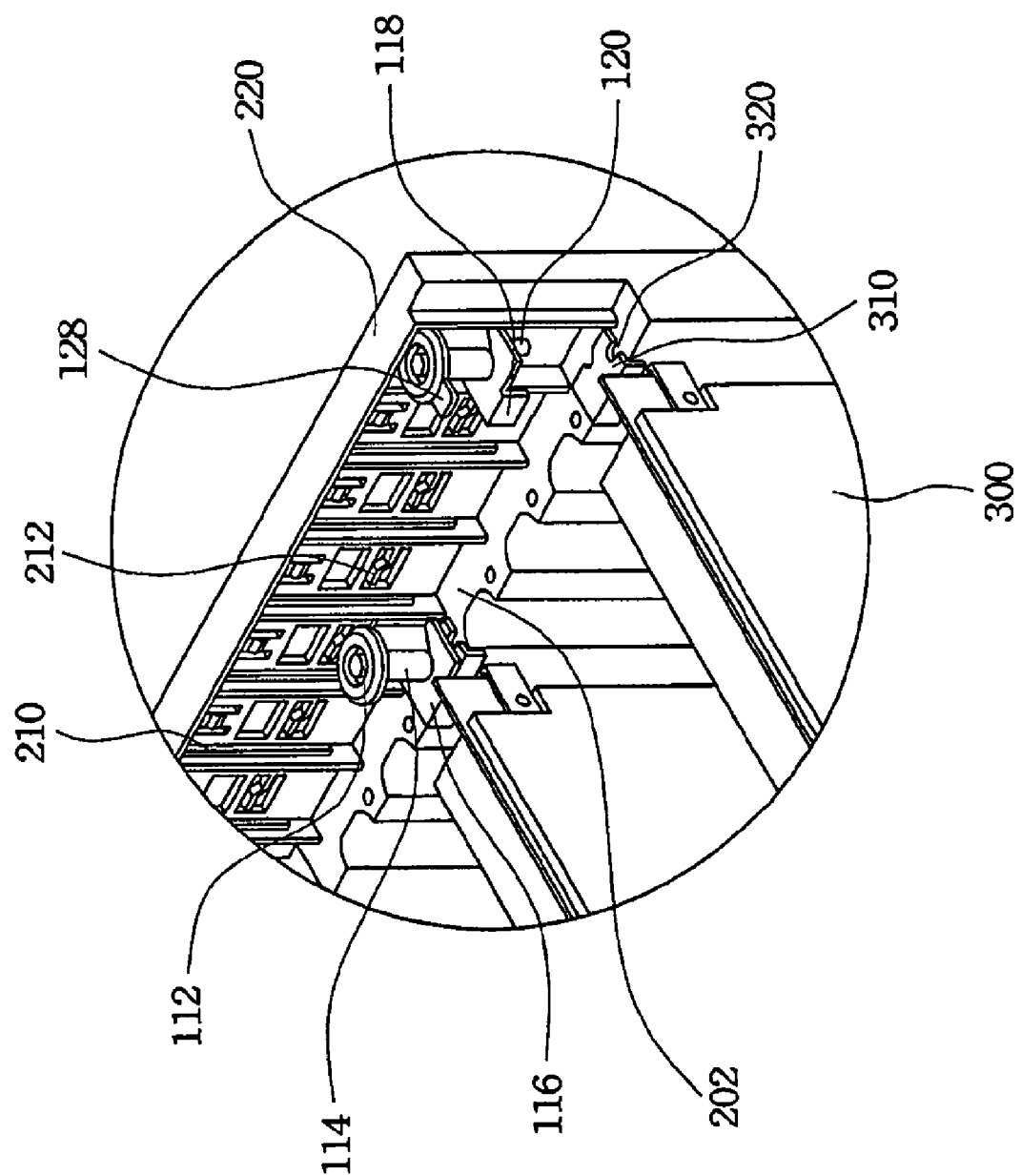
FIG. 2 is a schematic diagram of a second embodiment of the interface card installation apparatus of the invention.

Refer to FIG. 2. FIG. 2 illustrates a schematic diagram of a second embodiment of the interface card installation apparatus of the invention. The base 220 may have a rail 210. The rotating pressing means 110 may be disposed and slid on the rail 210. The rotating pressing means 110 includes a rotating piece 112 and a pressing piece 114. The rotating piece 112 is coupled in the pressing piece 114. The rotating piece 112 and the pressing piece 114 is a coaxial disposition. The rotating piece 112 has a bottom 116. The interface card installation apparatus 100 may use the pressing piece 114 to press the bracket 310 between the bottom 116 and the interface card flange 202 to further fix the interface card 300. The rotating piece 112 disposed in the pressing piece 114 may be rotated to couple with the coupling portion 212 to fix the pressing piece 114.

The coupling portion 212 may include a cavity. The rotating piece 112 may have an insert portion 128. The rotating piece 112 may be rotated to couple the insert portion 128 with the cavity of the coupling portion 212 of the case 200 when the bracket 310 is pressed on the interface card flange 202 with the bottom 116 of the pressing piece 114. The bracket 310 may be fixed when the insert portion 128 is coupled with the coupling portion 212 and the interface card 300 pressed by the bracket 310 may also be fixed.

The interface card flange 202 of the case 200 and the bracket 310 may further have a positioning hole 320. The bottom 116 of the pressing piece 114 may have a positioning pin 120 disposed corresponding to the positioning hole 320. The positioning pin 120 of the bottom 116 may be coupled with the positioning hole 320 to fix the bracket 310 and the interface card 300 when the bracket 310 is pressed between the bottom 116 and the interface card flange 202.

Figure 3:
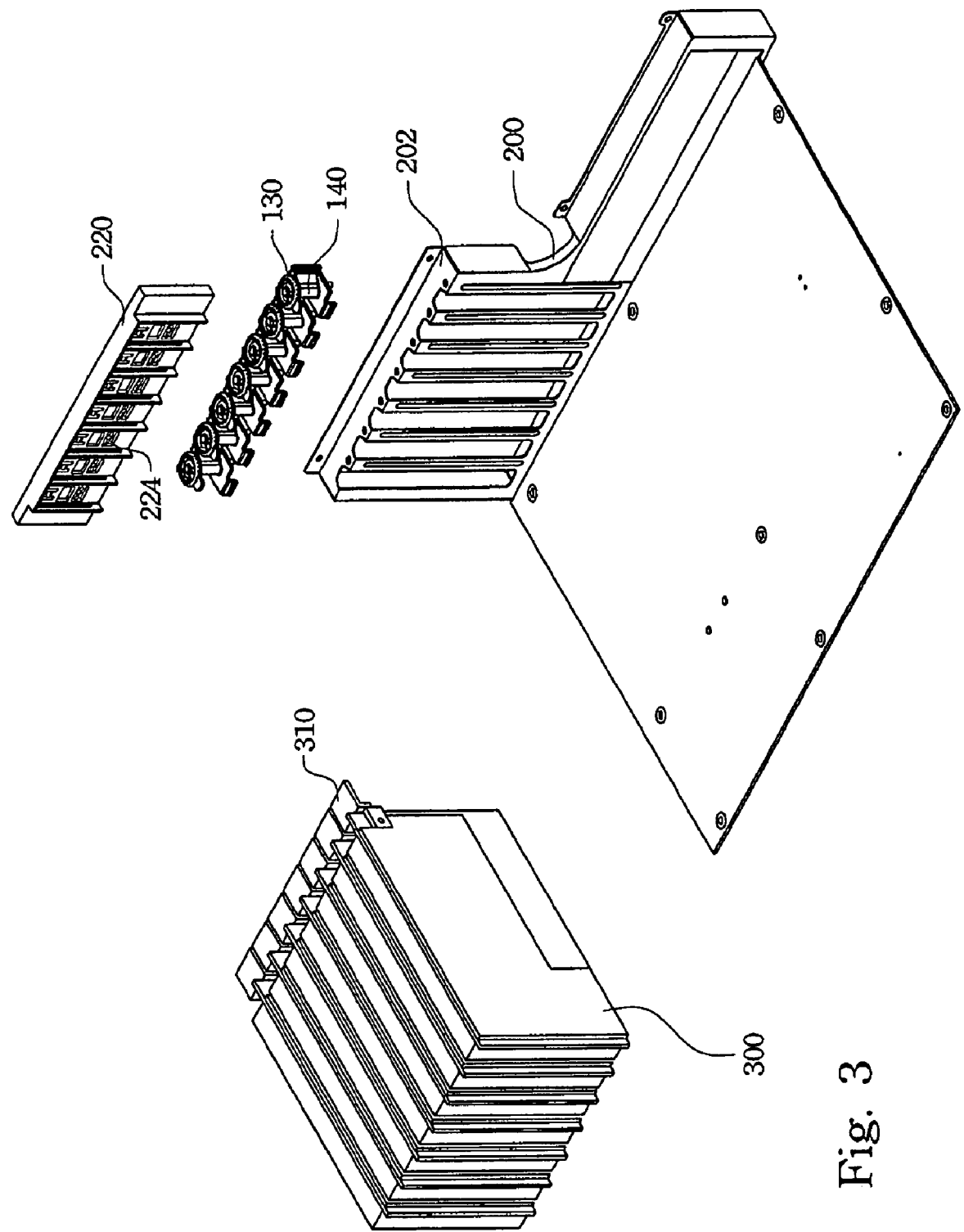
FIG. 3 is a schematic diagram of a third embodiment of the interface card installation apparatus of the invention.

Refer to FIG. 3. FIG. 3 illustrates a schematic diagram of a third embodiment of the interface card installation apparatus of the invention. The interface card installation apparatus 100 includes the case 200, the base 220 disposed on the case 200, the interface card 300 with the bracket 310, and the rotating pressing means 110 disposed in the base 220. The case 200 has the interface card flange 202 and the bracket 310 is in contact with the interface card flange 202. The rotating pressing means 110 may press the bracket 310 on the interface card flange 202 to fix the interface card 300. The base 220 has the coupling portion 224. The rotating pressing means 110 may be rotated to couple with the coupling portion 224 of the base 220 to fix the rotating pressing means 110 and the pressed bracket 310.

Figure 4:
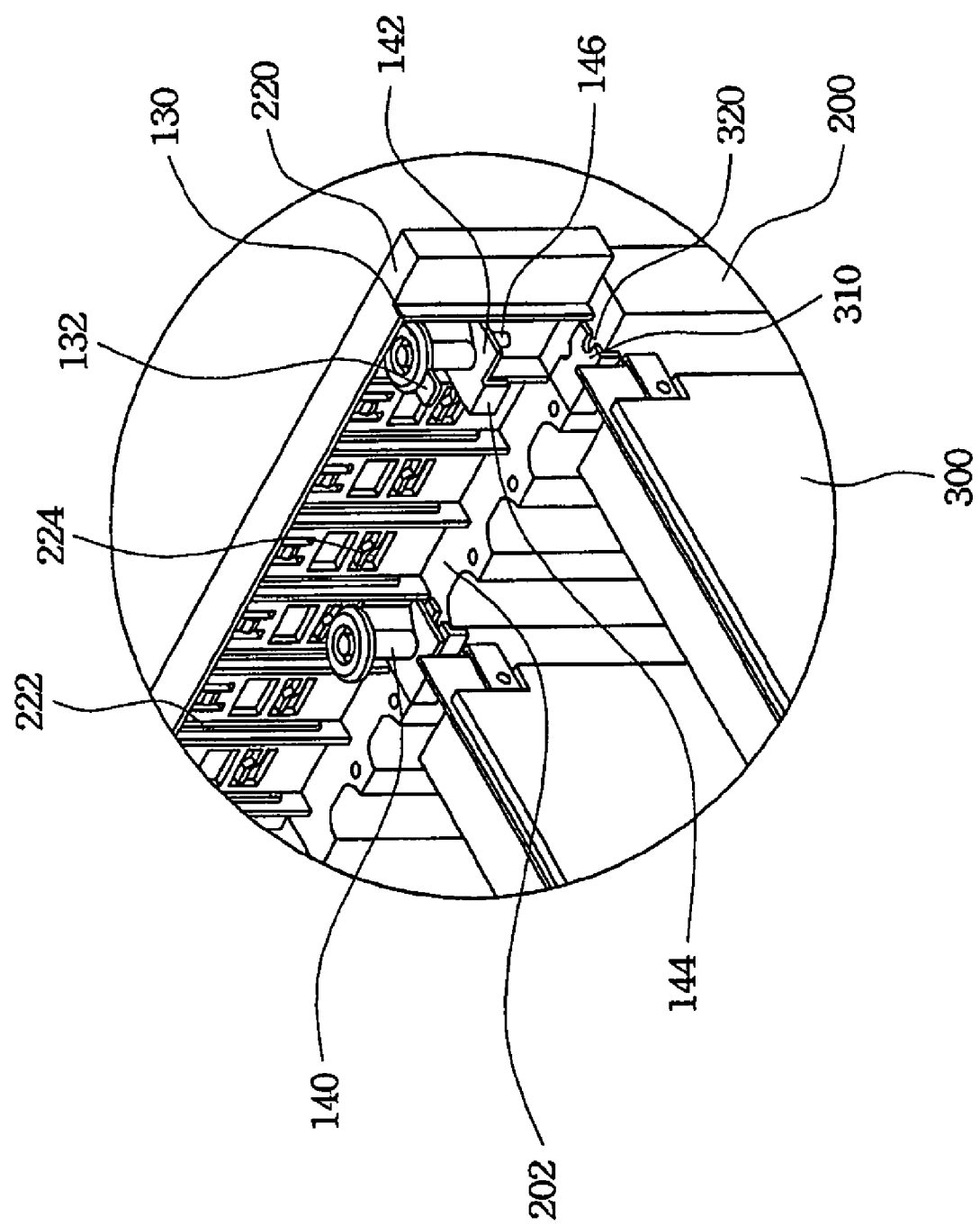
FIG. 4 is a schematic diagram of a forth embodiment of the interface card installation apparatus of the invention.

Refer to FIG. 4. FIG. 4 illustrates a schematic diagram of a forth embodiment of the interface card installation apparatus of the invention. The rotating pressing means 110 includes the rotating piece 130 and the pressing piece 140. The base may include the rail 222, and the pressing piece 140 is disposed and slid on the rail 222. The rotating piece 130 and the pressing piece 140 is the coaxial disposition. The pressing piece 140 has the bottom 142. The interface card installation apparatus 100 may press the bracket 310 between the bottom 142 and the interface card flange 202 to fix the interface card 300. The rotating piece 130 in the pressing piece 140 may be rotated to couple with the coupling portion 224 of the base 220 to fix the pressing piece.

The coupling portion 224 of the base 220 may include the cavity. The rotating piece 130 may include the insert portion 132. The rotation piece 130 in the pressing piece 140 may be rotated to couple the insert potion 132 with the cavity of the coupling portion 224 to fix the rotating piece 130 and the pressing piece 140 when the pressing piece 140 presses the bracket 310 on the interface card flange 202.

The interface card flange 202 of the case 200 and the bracket 310 may further have the positioning hole 320. The bottom 142 of the pressing piece 140 may have the positioning pin 146 disposed corresponding to the positioning hole 320. The positioning pin 146 of the bottom 142 may be coupled with the positioning hole 320 to fix the bracket 310 and the interface card 300 when the bracket 310 is pressed between the bottom 142 and the interface card flange 202.

The bracket 310 of the interface card 300 may be an L-shaped bracket. The L-shaped bracket is in contact with the interface card flange 202. The bottom 142 of the pressing piece 140 may have an extending portion 144. The extending portion 144 is extended from a side near the interface card 300 of the bottom 142, and the extended portion 144 may be mounted on the L-shaped bracket to prevent the bracket 310 moving between the bottom 142 and the interface card flange 202. The case 200 may have a plurality of interface card slots. The interface card 300 may be inserted in the interface card slot and be fixed by the interface card installation apparatus 100.

Figure 5:
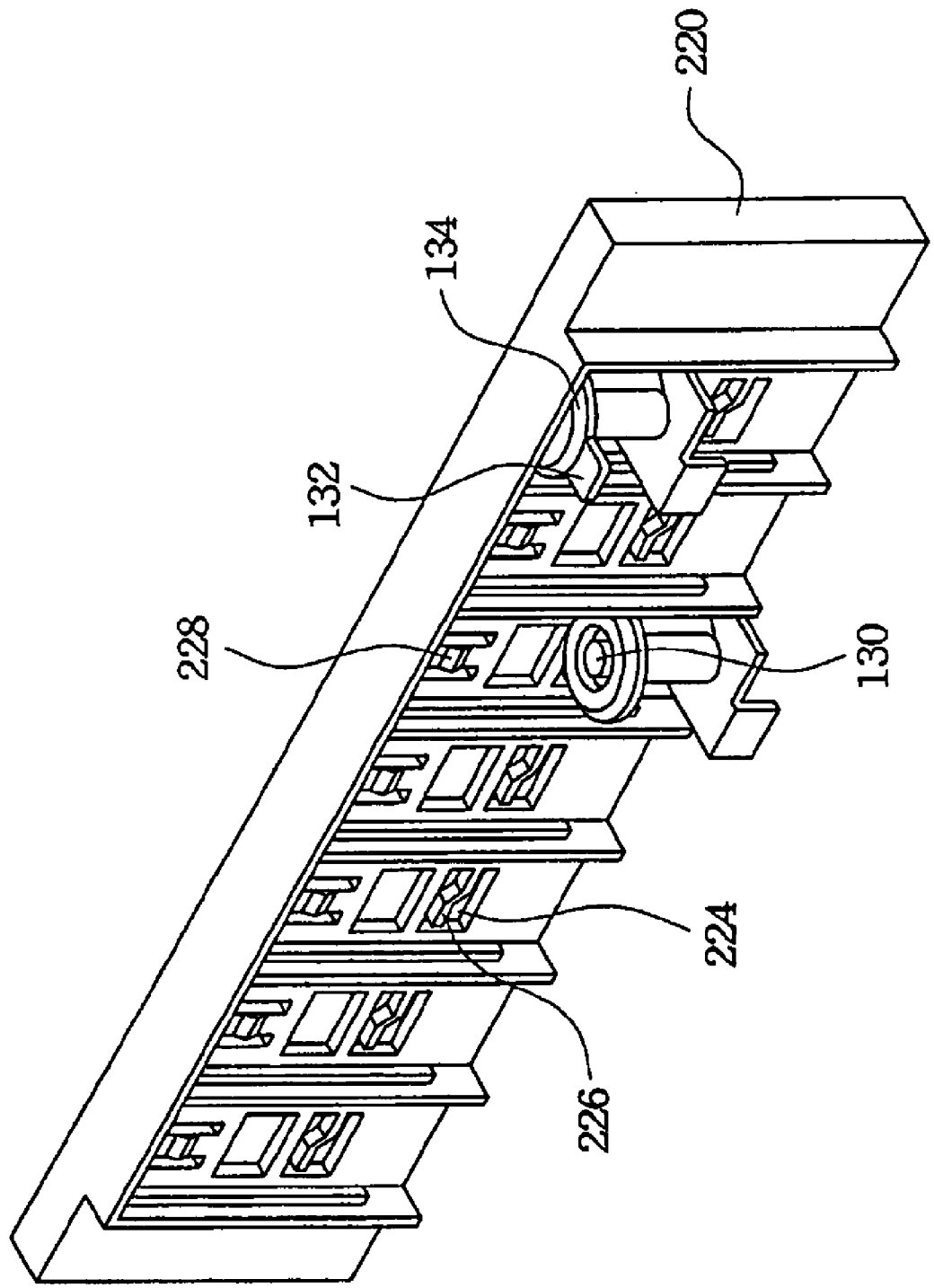
FIG. 5 is an oblique diagram of an embodiment of a base of the interface card installation apparatus of the invention.

Refer to FIG. 5. FIG. 5 illustrates an oblique diagram of an embodiment of a base of the interface card installation apparatus of the invention. The coupling portion 224 may include a guiding portion 226 extended in the cavity for guiding the insert portion 132 when the insert portion 132 couples with the cavity of the coupling portion 224. The pressing piece 140 may be fixed on the interface card flange 202 when the insert portion 132 couples with the coupling portion 224. The base 220 may include a positioning protrusion 228 disposed over the cavity of the coupling portion 224. The positioning protrusion 228 may be an elastic structure. The rotating piece 130 may include a rim 134. The rim 134 of the rotating piece 130 may be lifted over the positioning protrusion 228 and place on the positioning protrusion 228 when raising the rotating piece 130 and the pressing piece 140 to replace the interface card 300. The rim 134 may be coupled with the positioning protrusion 228 to support the rotating piece 130 and the pressing piece 140 with the positioning protrusion 228. The material of the base 220, the pressing piece 140, and the rotating piece 130 may be plastic.

According to the above embodiments of the invention, the interface card installation apparatus may press the bracket on the interface card flange with the pressing piece. The pressing piece, the bracket, and the interface card may be fixed by coupling the rotating piece with the coupling portion. The interface card installation apparatus may fix the interface card without using the screws, thus may reduce the assembly time and prevent screws left in the computer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interface card installation apparatus, comprising:
   a case having a base, an interface card flange, and a coupling portion, wherein the coupling portion comprises a cavity, wherein the base comprises a positioning protrusion disposed over the cavity;
   an interface card having a bracket, the bracket touches the interface card flange; and
   a rotating pressing means disposed in the base to press the bracket on the interface card flange, wherein the rotating pressing means comprises a rotating piece with an insert portion, such that the rotating piece is rotated to couple the insert portion with the cavity for fixing the bracket of the interface card, and the rotating piece comprises a rim, wherein the rim is placed on the positioning protrusion to support the rotating pressing means when the rotating pressing means is lifted.

2. The interface card installation apparatus of claim 1, wherein the base comprises a rail and the rotating pressing means is slid in the rail.

3. The interface card installation apparatus of claim 1, wherein the rotating pressing means comprises a pressing piece, and the rotating piece is coupled and rotated in the pressing piece, the bracket is pressed on the interface card flange with the pressing piece and the bracket is fixed by coupling the rotating piece with the coupling portion.

4. The interface card installation apparatus of claim 3, wherein the pressing piece has a bottom to press the bracket on the interface card flange.

5. The interface card installation apparatus of claim 4, wherein the interface card flange and the bracket have a positioning hole, the bottom of the pressing piece has a positioning pin disposed corresponding to the positioning hole, wherein the positioning pin is coupled with the positioning hole to fix the bracket.

6. The interface card installation apparatus of claim 3, wherein the rotating piece and the pressing piece is a coaxial disposition.

7. The interface card installation apparatus of claim 1, wherein the coupling portion includes a guiding portion extended in the cavity for guiding the insert portion to couple with the cavity.

8. An interface card installation apparatus, comprising:
a case having an interface card flange;
a base disposed on the case, wherein the base has a coupling portion comprising a cavity, a positioning protrusion disposed over the cavity;
an interface card with a bracket, wherein the bracket is in contact with the interface card flange; and
a rotating pressing means disposed in the base to press the bracket on the interface card flange, wherein the rotating pressing means comprises a rotating piece with an insert portion, such that the rotating piece is rotated to couple the insert portion with the cavity for fixing the bracket of the interface card, and the rotating piece comprises a rim wherein the rim is placed on the positioning protrusion to support the rotating pressing means when the rotating pressing means is lifted.

9. The interface card installation apparatus of claim 8, wherein the base comprises a rail and the rotating pressing means is slid in the rail.

10. The interface card installation apparatus of claim 8, wherein the rotating pressing means comprises a pressing piece, and the rotating piece is coupled and rotated in the pressing piece, the bracket is pressed on the interface card flange with the pressing piece and the bracket is fixed by coupling the rotating piece with the coupling portion.

11. The interface card installation apparatus of claim 10, wherein the pressing piece has a bottom to press the bracket on the interface card flange.

12. The interface card installation apparatus of claim 11, wherein the interface card flange and the bracket have a positioning hole, the bottom of the pressing piece has a positioning pin disposed corresponding to the positioning hole, wherein the positioning pin is coupled with the positioning hole to fix the bracket.

13. The interface card installation apparatus of claim 11, wherein the bracket is an L-shaped bracket, the bottom of the pressing piece has an extended portion extended from a side near the interface card of the bottom, the extended portion is mounted to the L-shaped bracket to prevent the bracket removing between the bottom and the interface card flange.

14. The interface card installation apparatus of claim 10, wherein the rotating piece and the pressing piece is a coaxial disposition.

15. The interface card installation apparatus of claim 10, wherein a material of the base, the rotating piece, and the pressing piece is a plastic.

16. The interface card installation apparatus of claim 8, wherein the coupling portion comprises a guiding portion extended in the cavity for guiding the insert portion when the insert portion is coupling with the cavity.

17. An interface card installation apparatus, comprising:
a case having a base, an interface card flange, and a coupling portion, wherein the coupling portion comprises a cavity and the base comprises a positioning protrusion disposed over the cavity;
an interface card having a bracket, the bracket touches the interface card flange; and
a rotating pressing means disposed in the base to press the bracket on the interface card flange, wherein the rotating pressing means is coupled with the coupling portion, wherein the rotating pressing means comprises a rotating piece, and the rotating piece comprises a rim, wherein the rim is placed on the positioning protrusion to support the rotating pressing means when the rotating pressing means is lifted.

18. The interface card installation apparatus of claim 17, wherein the rotating pressing means further comprises a pressing piece, and the rotating piece is coupled and rotated in the pressing piece, the bracket is pressed on the interface card flange with the pressing piece and the bracket is fixed by coupling the rotating piece with the coupling portion.

19. The interface card installation apparatus of claim 18, wherein the rotating piece further comprises an insert portion, wherein the rotation piece in the pressing piece is rotated when the pressing piece presses the bracket to couple the insert potion with the cavity to fix the rotating piece and the pressing piece.

20. The interface card installation apparatus of claim 17, wherein the interface card flange and the bracket have a positioning hole, a bottom of the pressing piece has a positioning pin disposed corresponding to the positioning hole, wherein the positioning pin is coupled with the positioning hole to fix the bracket.

* * * * *